United States Patent [19]

Liu

[11] 4,115,708
[45] Sep. 19, 1978

[54] FAST-SWITCHING PULSE MODULATOR

[75] Inventor: Shing-Gong Liu, Princeton, N.J.

[73] Assignee: RCA Corporation, New York, N.Y.

[21] Appl. No.: 708,219

[22] Filed: Jul. 23, 1976

[51] Int. Cl.² ........................ H03K 5/01; H03K 1/00; H03K 3/335

[52] U.S. Cl. ................................ 307/268; 307/318; 331/107 R; 333/1.1

[58] Field of Search ............... 307/263, 264, 268, 270, 307/286, 318, 319, 322; 357/57; 331/107 R; 333/1.1

[56] References Cited

U.S. PATENT DOCUMENTS 3,743,967   7/1973   Fitzsimmons et al. ................. 357/57

*Primary Examiner*—John Zazworsky
*Attorney, Agent, or Firm*—H. Christoffersen; Joseph D. Lazar; Robert M. Rodrick

[57] ABSTRACT

A fast-switching pulse modulator for generating a high-power output pulse in response to a low-power input pulse to apply a bias signal to a microwave apparatus having a high efficiency avalanche semiconductor diode such as a TRAPATT diode or IMPATT diode formed of GaAs. The modulator uses a transistor operating in a switching mode. The transistor is biased to a non-conducting state preferably by a negative D.C. bias voltage and switched to a first conducting mode upon application of the positive input pulse to the transistor. At this first conducting mode the transistor switches current from zero to a low-current level during which no RF output signal exists. Upon application of a threshold signal to, for example, the TRAPATT diode, the diode is triggered into the TRAPATT mode generating thereby an RF output pulse. As the diode is triggered into the TRAPATT mode the transistor is switched to a second conducting mode at a high current level. The rise time of the RF output pulse is fast as a result of the transistor switching from the low-current level to the high-current level.

7 Claims, 6 Drawing Figures

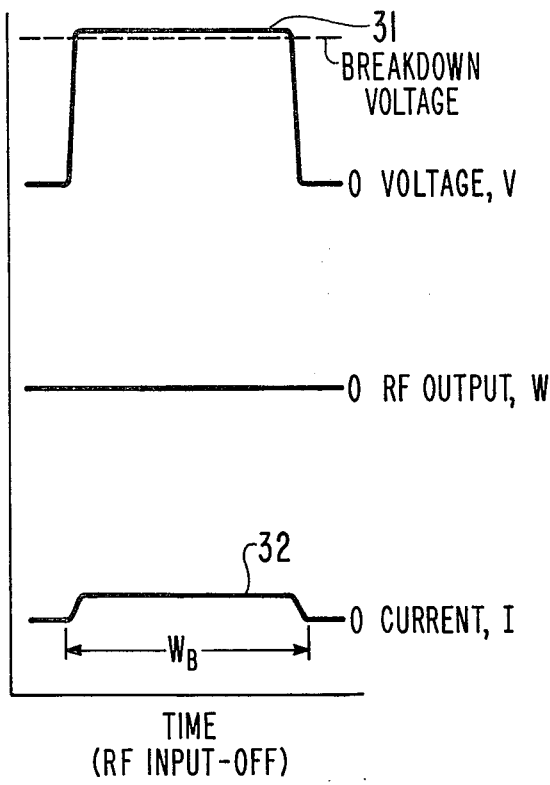
Fig. 3a (RF INPUT-OFF)
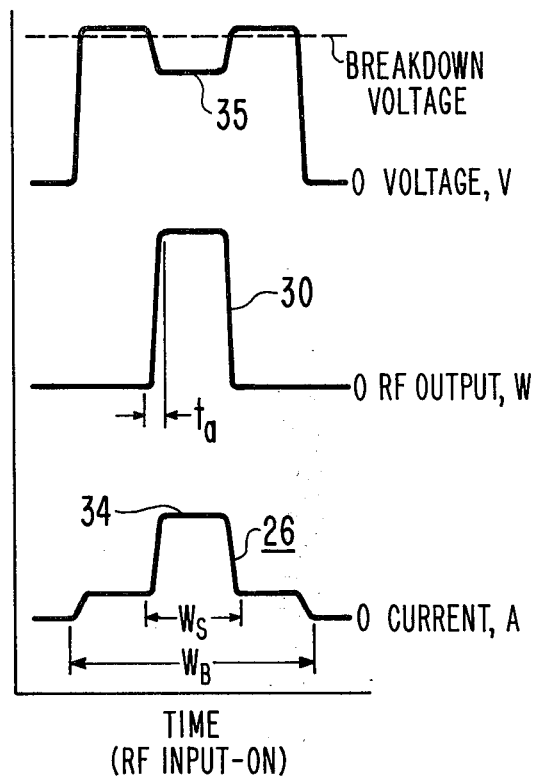
Fig. 3b (RF INPUT-ON)
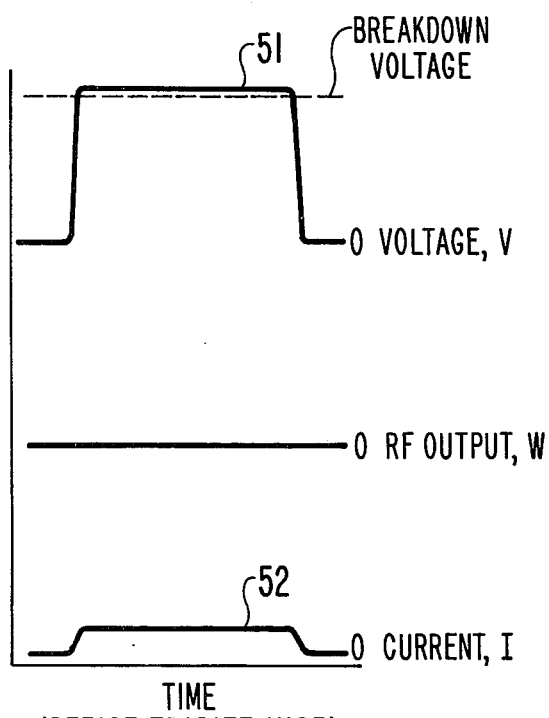
Fig. 4a (BEFORE TRAPATT MODE)
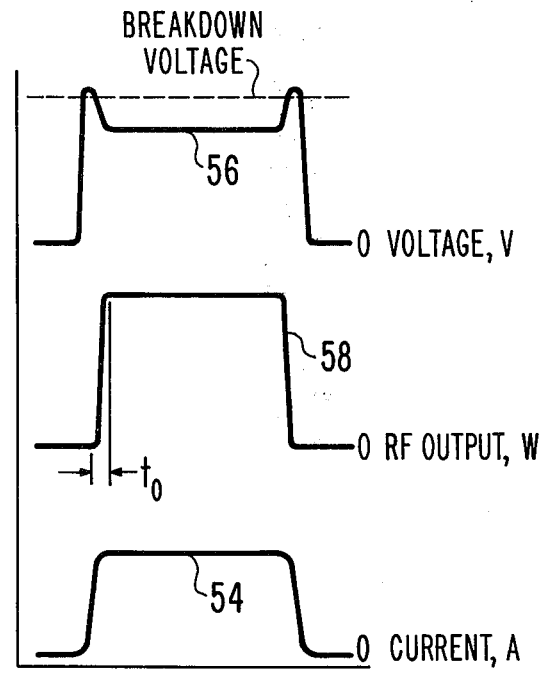
Fig. 4b (DURING TRAPATT MODE)

FAST-SWITCHING PULSE MODULATOR

The Government has rights in this invention pursuant to Contract No. DAAB07-75-C-1287 awarded by the Department of the Army.

BACKGROUND OF THE INVENTION

1. Field of the Invention

This invention relates to a pulse modulator and more particularly to a fast-switching pulse modulator for applying a bias signal to a microwave apparatus having a TRAPATT or GaAs IMPATT-type diode.

2. Description of the Prior Art

The operation of a microwave amplifier or oscillator having a high efficiency avalanche diode such as a TRAPATT diode or a gallium-arsenide (GaAs) IMPATT diode requires a high-power pulse generator to provide the pulse power to the diode. Conventional generators, for example, commercially available under the tradename "Velonex", which provide a high pulsed-power output from a low-power input are typically bulky and costly and are primarily used for laboratory purposes.

In an effort to reduce the size of the pulse generators and make them cost-effective, application of pulse power to high efficiency avalanche diodes in the prior art is achieved by a modulator utilizing one or more transistors. A low-power modulator using a transistor which is capable of delivering large pulse power is described in an article entitled "Low-Cost Pulsing of Avalanche Diodes" by A. S. Clorfeine, R. D. Hughes and S. Weisbrod published in the RCA Review, Vol. 32, No. 3, September, 1971. A d.c. voltage is applied to the diode concurrent with the pulse.

Other prior art modulators have been developed which make use of the characteristics of the TRAPATT diode or GaAs IMPATT diode in a microwave apparatus in an attempt to provide a lower voltage pulse than that provided by conventional pulsers. The lower voltage requirement allows for smaller, simpler and thus less expensive pulsers. For example, according to the present understanding of the principles of operation, a TRAPATT diode requires a fast-rising threshold voltage (on the order of twice the breakdown voltage) to initiate the diode into the TRAPATT mode of operation when the diode is placed in a suitable circuit. (See, for example, W. J. Evans, "Circuits for High Efficiency Avalanche-Diode Oscillators", IEEE Trans. Microwave Theory Tech., Vol. MTT-17, pp. 1060–1067, Dec. 1969.) Typically, in the case of an oscillator circuit, the diode is reverse biased by a pulsed or D.C. voltage. The TRAPATT mode can be initiated by a fast-rising pulse or IMPATT oscillation. For an amplifier, the diode is usually reverse biased at a lower voltage than the threshold voltage. Application of an RF input signal of sufficient amplitude will combine with the bias signal to trigger the diode into the TRAPATT mode. Upon meeting the threshold conditions for the high efficiency mode of either the TRAPATT diode or GaAs IMPATT diode, the diode operation voltage (average d.c. voltage) drops sharply and a large current (average d.c. current) is drawn through the diode creating a negative resistance of the diode. The prior art modulators make use of the fact that below its breakdown voltage, a high efficiency avalanche diode is an open circuit and can be D.C. biased in that region. (See, A. Rosen, J. F. Reynolds, S. G. Liu, and G. E. Theriault, "Wideband Class-C Trapatt Amplifiers," RCA Review, Vol. 33, pp. 729–736, 1972.) Thus, a lower voltage from a pulser can be used to trigger the diode into the high efficiency mode of operation when the diode is pre-biased below the threshold voltage.

A disadvantage of these prior art modulators is in the rise time of the RF output pulse of the microwave apparatus. It is often desirable that the rise time of the output pulse be as rapid as possible, in particular, in systems where the period of the pulsed signal is very short. Generally, the switching time of the output pulse of the apparatus is limited by the rise time of the pulse of the current through the diode. Typically, the current pulse is switched from zero to its desired value as the diode is triggered into the high efficiency mode generating thereby an RF output pulse, such an increase in current resulting in a relatively slow rise time of the output pulse.

SUMMARY OF THE INVENTION

According to the present invention, a fast-switching pulse modulator is provided for generating a high-power output pulse in response to a low-power input signal to apply a bias signal to a microwave apparatus having a high efficiency avalanche diode. The pulse modulator comprises a transistor and means for biasing the transistor such that it is in a non-conducting mode. Included in the pulse modulator is means responsive to the low-power input pulse for switching the transistor into a first conducting mode during each of the pulse periods. During the first conducting mode the transistor is driven into saturation and biased to a low-current level. No RF output signal exists during this first conducting mode. Upon application of a pulsed threshold signal to the diode, the diode is triggered into the high efficiency mode, generating thereby an RF output signal. As the diode is triggered into high efficiency operation, a d.c. negative resistance is induced and the transistor is switched to a second conducting mode at a high-current level. The rise time of the RF output pulse is determined by the rise time of the current from the low-current level to the high-current level.

BRIEF DESCRIPTION OF THE DRAWING

FIGS. 3(a) and 3(b) are curves showing various waveforms used in describing the present invention in the embodiment of a microwave amplifier.

FIGS. 4(a) and 4(b) are curves showing various waveforms used in describing the present invention in the embodiment of a microwave oscillator.

DETAILED DESCRIPTION OF THE PREFERRED EMBODIMENT

Figure 1:
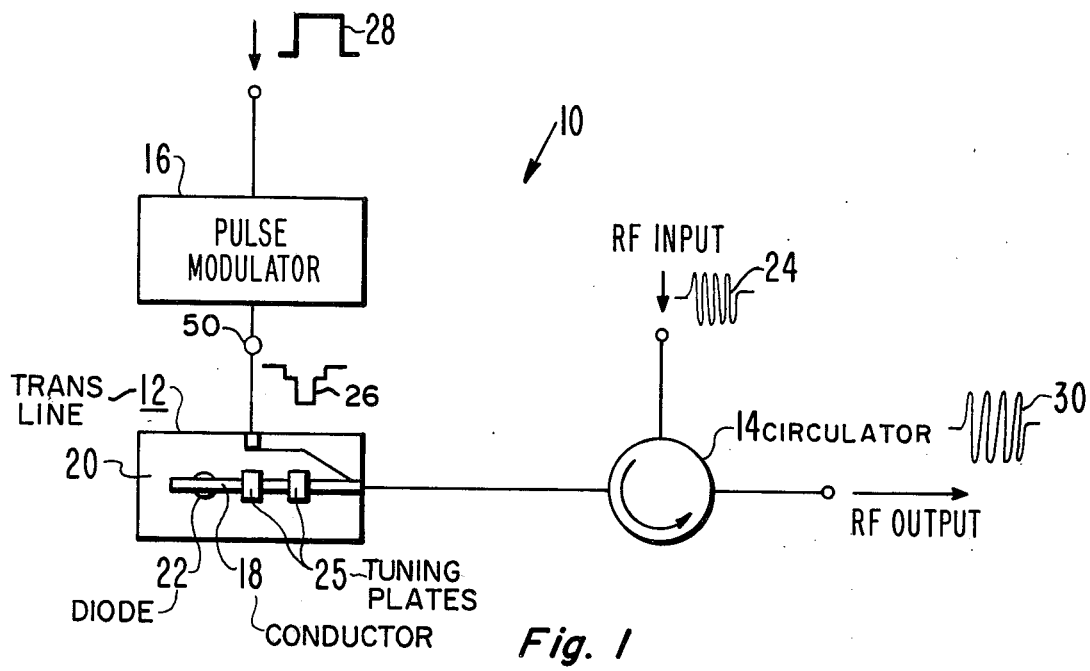
FIG. 1 is a schematic representation of a microwave amplifier embodying the present invention.

Referring to the drawing, there is shown in FIG. 1 a schematic representation of a microwave apparatus 10 in the preferred embodiment as an amplifier. Amplifier 10 comprises a transmission-line circuit 12, preferably of the microstrip circuit configuration, a circulator 14 and a pulse modulator 16. In the preferred microstrip circuit form, transmission-line circuit 12 includes a top conductor 18 mounted on a substrate 20 of a suitable dielectric material and a ground plane (not shown) on the surface of substrate 20 opposite top conductor 18. Tuning is provided by tuning plates, 25, suitably placed on conductor 18. Other circuits such as, for example, coaxialline circuits, waveguide circuits, and strip-line circuits may also be used. Mounted in transmission-line circuit 12 in a preferred embodiment of the invention is a high efficiency semiconductor avalanche diode 22 constructed to operate in the TRAPATT mode such as described in U.S. Pat. No. 3,600,649 issued on Aug. 17, 1971. Such a TRAPATT diode exhibits a negative resistance when reversed biased into breakdown and driven into the TRAPATT mode of operation as described above.

Circulator 14 is connected to transmission-line circuit 12 to couple a microwave pulsed RF input signal 24 from an external source (not shown) to diode 22.

Pulse modulator 16 is connected to transmission-line circuit 12 to apply a high-power pulsed bias signal 26 to operate amplifier 10. Pulse modulator 16 generates high-power pulsed signal 26 from a low-power pulsed input signal 28, using a transistor circuit (FIG. 2) as explained below, such that during the application of RF input signal 24, an amplified pulsed RF output signal 30 is generated, the pulse of output signal 30 having a fast rise time.

In the preferred embodiment of the invention, amplifier 10 is arranged to operate in a quasi class-C mode. In the quasi class-C mode diode 22 draws a low level current during a prebias-pulse period prior to the application of the input RF signal. Since TRAPATT diode 22 draws current only during the pulsed period, there is a significant reduction in power dissipation over amplifiers biased by a continuous wave (cw) voltage. Furthermore, there is no danger of burning out diodes as a result of excessive power dissipation when the circuit is not suitably tuned. As illustrated in FIG. 3(a), in the absence of an RF input signal, pulse modulator 16 biases TRAPATT diode 22 by a pulsed voltage 31 at or slightly above its breakdown voltage but below the threshold voltage such that diode 22 draws current at a low-current level 32, having a predetermined pulse width, $W_B$, the same as the pulse width of input signal 28. No RF output signal exists under this low current bias condition. Upon application of RF input signal 24, the RF voltage combines with pulsed voltage 31 to exceed the threshold voltage triggering the diode into the TRAPATT mode of operation. Amplifier 10 may be suitably adjusted for amplification during the TRAPATT mode by tuning elements 25 as shown in FIG. 1. As shown in FIG. 3(b), the voltage drops sharply to a voltage level 35 below the breakdown value during the TRAPATT mode and the bias current increases to a desired high-current level 34. The pulse width, $W_S$, of RF input signal 24 is equal to or less than the pulse width, $W_B$, of input bias signal 28, RF input signal 24 being synchronized with input bias signal 28. The increase in bias current is a result of the RF induced negative resistance occurring as diode 22 operates in the TRAPATT mode. Upon being triggered into the TRAPATT mode, diode 22 generates a pulsed RF output signal 30 having a pulse rise time, $t_a$. The rise time, $t_a$, is fast compared to the rise time of conventional pulse-modulated amplifiers as a result of switching from low-current level 32 to high current level 34 in pulse modulator 16, described below.

Figure 2:
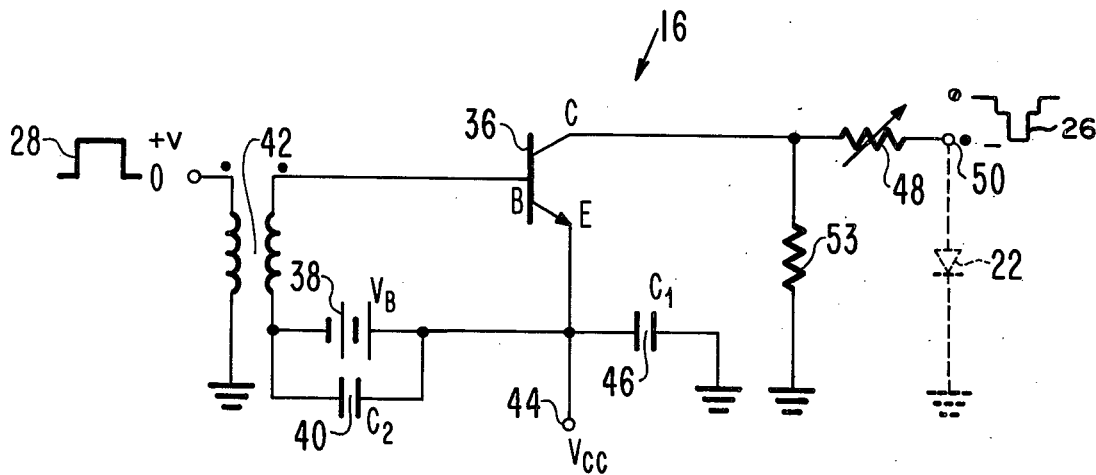
FIG. 2 is a schematic circuit representation of a preferred embodiment of the invention.

Pulse modulator 16 as shown schematically in FIG. 2, comprises a transistor 36 having a base, B, collector, C, and emitter, E, electrodes, transistor 36 being capable of handling high current and high power. Although a single transistor is shown, a plurality of transistors configured to provide similar characteristics as transistor 36 may also be used.

Transistor 36 is arranged to operate in the switching mode. Transistor 36 is biased to a non-conducting mode, i.e., an "OFF" condition by a D.C. bias voltage from a voltage source 38 having a voltage, $V_b$. The magnitude of $V_b$ depends on the transistor used. In the present circuit, the voltage $V_b$ is −7 volts, the voltage source 38 being connected to emitter electrode E of transistor 36 to provide a negative bias to transistor 36. A capacitor, 40, having a capacitance, $C_2$, may be connected in shunt with voltage source 38 to accumulate undesirable transient voltages.

Transistor 36 is driven to a first conducting mode, i.e., "ON" condition, by applying input pulse signal 28 to the base, B, input signal 28 being positive in the circuit configuration shown. In a preferred embodiment of the invention pulse signal 28 is applied to transistor 36 through a pulse transformer 42 to isolate the D.C. of the input pulse signal 28 from the RF signal. Other D.C. isolation means, such as, for example, a capacitor may also be used. Emitter electrode, E, is connected as by terminal 44 to a voltage source (not shown) having a voltage $V_{cc}$, voltage $V_{cc}$ being negative with respect to ground to make the collector electrode, C, positive with respect to the emitter electrode, E. A capacitor 46 having a capacitance $C_1$ may be connected in shunt with voltage $V_{cc}$ to by-pass the RF signal to ground.

A variable resistor 48 is serially connected in a preferred embodiment of the invention with one end to collector electrode, C, of transistor 36 and the other end to output terminal 50, terminal 50 being connected to TRAPATT diode 22 in transmission-line circuit 12. Resistor 48 controls the internal impedance of modulator 16 to a desired value, such controlled impedance limiting the operating current of the TRAPATT diode 22 during the TRAPATT mode of operation. Such a current limiting feature prevents diode 22 from burning out due to excessive current. A resistor 53 may also be placed in shunt with TRAPATT diode 22 to control the voltage across diode 22.

Upon application of input pulse signal 28 to modulator 16, the transistor switches from the "OFF" condition to the first "ON" condition as the voltage $V_{cc}$ is applied to transistor 36. The transistor characteristics and the load resistance in series with diode 22 are suitably arranged such that upon application of input pulse 28 TRAPATT diode is biased at or slightly above its breakdown value in the absence of an RF input signal. At this first "ON" state, the current switches from zero to a low-current level 32 as shown in FIG. 3(a). This first conducting mode is a high-voltage, high impedance state during which no RF signal exists. Thus, the rise time from the "OFF" to the first "ON" condition does not, of course, directly affect the rise time of the RF output signal.

When pulsed RF input signal 24 is applied, the voltage of signal 24 combines with the bias voltage 31 applied by modulator 16 to diode 22 at the low-current bias level to trigger diode 22 into the TRAPATT mode of operation. Transistor 36 is thus switched from the first conducting mode to a second "ON" condition at high-current level 34 (FIG. 3b) as a result of the RF induced negative resistance of diode 22 during TRAPATT operation. At the second "ON" condition, which is a high-current, low-impedance state, there is a voltage drop across diode 22 corresponding to the increase in the current. During the TRAPATT operation, RF output pulse 30 is generated, RF output pulse 30 having a fast rise time. The fast rise time of RF output pulse 30 is produced by the switching of transistor 36 from the first conducting mode to the second conducting mode.

Furthermore, in addition to switching from a low-current "ON" state to a high-current "ON" state, transistor 36 is driven into the saturation region in the low-current state to contribute to the short rise time of RF output pulse 30. During saturation, i.e., the condition at which the maximum current is passing through transistor 36, charges are stored in the base and collector regions of transistor 36. The accumulated charges help to shorten the rise time as transistor 36 switches into the low-impedance, high current state. It can be shown that the transistor must be driven into saturation in the first switching step. To meet the requirements of the high current, low-impedance state, the base current, $I_B$ must satisfy the expression $$I_B \geq I_{C2}/h_{FE2} \quad (1)$$

where $I_{C2}$ refers to the collector current for the second-switching (high-current) step and $h_{FE2}$ refers to the D.C. forward current transfer ratio corresponding to $I_{C2}$. Since the following expressions hold true:

$$I_{C1} << I_{C2} \quad (2)$$

and $$h_{FE1} > h_{FE2} \quad (3)$$

and the base current does not change during the two switching states, the following expression can be obtained by combining equations (1), (2), and (3)

$$I_B >> I_{C1}/h_{FE1} \quad (4)$$

Equation (4) indicates that transistor 36 is driven into saturation in the low-current state, because $I_{C1}$ and $h_{FE1}$ refer, respectively, to the collector current and to the D.C. forward current transfer ratio for the first switching step, i.e., the low current state.

Although the preferred embodiment of the present invention has been described as a microwave amplifier as shown in FIG. 1, it may also be operated as a microwave oscillator. There are two major differences between the operation of an oscillator and the amplifier as previously described. First, circulator 14 is not used for an oscillator, since microwave energy from an external source is not required. Second, the magnitude of a pulsed or D.C. reverse bias voltage applied to diode 22, and the circuit tuning conditions, are adjusted to provide the TRAPATT mode of oscillation.

In the case of an oscillator, the characteristics of transistor 36 and the diode load resistance in pulse modulator 16 are arranged such that upon application of input pulse 28 TRAPATT diode 22 is biased by a voltage 51 at or slightly above its breakdown value as shown in FIG. 4(a) but below the threshold level. At this first oscillator "ON" state, transistor 36 switches the current from zero to a low-current level 52. This first conducting mode is a high-impedance state during which no RF signal exists. Diode 22 is triggered into the TRAPATT mode by adjusting the RF tuning conditions as by varying, for example, the location of tuning elements 25 (FIG. 1) to change the diode 22 load resistance. By changing diode 22 load conditions, the bias voltage applied to diode 22 during the first conducting mode increases such that it exceeds the threshold value thus triggering diode 22 into the TRAPATT mode. As diode 22 is tuned into oscillation, transistor 36 is switched from the first conducting mode to a second "ON" condition at a high current level 54 shown in FIG. 4(b). At this second conducting mode, which is a high-current, low impedance state, there is a voltage drop to a voltage level 56 below the breakdown voltage corresponding to the increase in current. During the TRAPATT operation, an RF output pulse 58 is generated, RF output pulse 58 having a fast rise time, $t_0$. The fast rise time, $t_0$, of RF output pulse 58 is produced by the switching of transistor 36 from the first conducting mode to the second conducting mode. Also, as in the case of the amplifier, transistor 36 is driven into the saturation region such that the charges stored in the base and collector regions of transistor 36 contribute to the fast output pulse 58 rise time.

Although the present invention has been described in the preferred embodiment utilizing a TRAPATT diode, an IMPATT diode formed of gallium-arsenide (GaAs) may also be used. A GaAs IMPATT diode is a high efficiency avalanche diode, and similar to a TRAPATT diode, exhibits a negative resistance when reversed biased into the high efficiency mode of operation. During the high efficiency mode of operation the GaAs IMPATT diode also exhibits a sharp drop in the average d.c. voltage and a large increase in the average d.c. current down through the diode. Such a diode can be used in an amplifier or oscillator as described above and biased by pulse modulator 16 to achieve an RF output pulse having a fast rise time.

What is claimed is:

1. In a microwave system including a fast-switching pulse modulator for generating and applying an output signal having first and second current levels in response to a low-power input D.C. pulse to a microwave apparatus including an avalanche semiconductor diode having a threshold value at which said diode is capable of operating in a high efficiency mode at a predetermined operating current, said diode generating, in response to a concurrently applied pulsed RF input signal, a microwave pulsed RF output signal, said system further including means for applying said pulsed RF input signal to said diode, and means for isolating the D-C. input pulse from RF signals, said modulator comprising:

a transistor having base, collector and emitter electrodes, said base and emitter electrodes being connected in a circuit to form an input circuit for said transistor for receiving said low-power input D.C. pulse, and said collector and emitter electrodes being connected in an output circuit with said diode, said diode being connected to shunt said collector and emitter electrodes; and means for biasing the input circuit of said transistor such that said transistor is in a non-conducting mode and such that said transistor responsive to said low power input D.C. pulse is switched to a first conducting mode at a saturated condition during application of each of said low-power input D.C. pulses, said transistor in said first conducting mode generating the first output current level of said output signal, said first output current level being lower than the level of said predetermined operating current of said diode;

whereby upon application of said concurrently applied pulsed RF input signal to said diode, said diode is triggered into the high efficiency mode of operation generating thereby said pulsed RF output signal and switching thereby said transistor to a second conducting mode generating said output signal at said second current level, said second current level being at least equal to said predetermined operating current of said diode, the rise time of said RF output signal being determined by the rise time of the output current from said first current level signal to said diode operating current level.

2. In a microwave system according to claim 1 further including variable resistor means serially connected between said avalanche diode and said collector electrode of said transistor for controlling the internal impedance of said modulator limiting thereby the current of said diode during the high efficiency mode of operation.

3. In a microwave system, according to claim 1, wherein said isolation means comprises a pulse transformer included within said transistor input circuit.

4. In a microwave system according to claim 1, wherein said avalanche semiconductor diode comprises a TRAPATT diode.

5. In a microwave system according to claim 1, wherein said avalanche semiconductor diode comprises a gallium-arsenide (GaAs) IMPATT diode.

6. In a microwave system according to claim 1, wherein said pulsed RF input signal has a pulse width equal to or less than the pulse width of said first output current level of said output signal of said modulator, the pulse of said RF input signal being synchronized with the pulse of said first current level signal, the combination of said RF input signal and said first current level signal having a magnitude exceeding the threshold value of said diode whereby said diode is triggered into amplifying said RF input signal.

7. In a microwave system according to claim 1, further including means for tuning said microwave apparatus to increase the first current level of said output signal to exceed the threshold value of said diode, the increased current level signal triggering said diode into said high efficiency mode of operation.

* * * * *